United States Patent [19]

McCutcheon

[11] Patent Number: 5,552,209
[45] Date of Patent: Sep. 3, 1996

[54] INTERNALLY DAMPED CIRCUIT ARTICLES

[75] Inventor: Jeffrey W. McCutcheon, Eagan, Minn.

[73] Assignee: Minnesota Mining and Manufacturing Company, Saint Paul, Minn.

[21] Appl. No.: 283,096

[22] Filed: Jul. 29, 1994

[51] Int. Cl.⁶ .................................................. B32B 9/00
[52] U.S. Cl. .................... 428/209; 428/324; 428/327; 428/332; 428/412; 428/413; 428/425.8; 428/458
[58] Field of Search ........................... 428/209, 324, 428/327, 332, 413, 458, 412

[56] References Cited

U.S. PATENT DOCUMENTS

| | | | |
|---|---|---|---|
| 2,819,032 | 1/1958 | Detrie et al. | 244/119 |
| 3,007,997 | 11/1961 | Panariti | 174/68.5 |
| 3,071,217 | 1/1963 | Gould | 52/222 |
| 3,078,969 | 2/1963 | Campbell et al. | 189/37 |
| 3,083,259 | 3/1963 | Wells | 174/68.5 |
| 3,159,249 | 12/1964 | Lazan | 188/268 |
| 3,160,549 | 12/1964 | Caldwell et al. | 161/161 |
| 3,813,582 | 5/1974 | Gikow | 317/101 DH |
| 3,816,911 | 6/1974 | Knappenberger | 29/626 |
| 3,833,836 | 9/1974 | Moksu et al. | 317/100 |
| 3,863,881 | 2/1975 | Fletcher et al. | 248/358 R |
| 4,053,943 | 10/1977 | Galvin | 188/266 |
| 4,382,587 | 5/1983 | Heinrich et al. | 267/160 |
| 4,566,231 | 1/1986 | Konsevich | 52/145 |
| 4,594,292 | 6/1986 | Nagai et al. | 428/461 |
| 4,681,816 | 7/1987 | Hashimoto et al. | 428/463 |
| 4,752,526 | 6/1988 | Daimon et al. | 428/461 |
| 5,108,802 | 4/1992 | Sattinger | 428/34.1 |
| 5,183,863 | 2/1993 | Nakamura et al. | 525/438 |
| 5,262,232 | 11/1993 | Wilfong et al. | 428/327 |
| 5,308,887 | 5/1994 | Ko et al. | 522/148 |

FOREIGN PATENT DOCUMENTS

| | | |
|---|---|---|
| 0603739 | 6/1994 | European Pat. Off. . |
| 03142893 | 6/1991 | Japan . |
| 06045774 | 3/1994 | Japan . |
| 940417 | 10/1963 | United Kingdom . |
| 2272107 | 5/1994 | United Kingdom . |
| WO92/21178 | 11/1992 | WIPO ........................... H04B 1/08 |

OTHER PUBLICATIONS

Manufacturing Technology Note, Dec. 1981, U.S. Army Materiel Development and Readiness Command, Office of Manufacturing Technology, Alexandria, Virginia Report Number: HDL.TM. 79.22 "Reducing Vibration forces in Circuit Boards".

Coombs, Jr., "Printed Circuits Handbook", 3rd Ed., McGraw–Hill Book Co., NY (1988) ISBN 0–07–012609–7.

*Primary Examiner*—Patrick J. Ryan
*Assistant Examiner*—Cathy Lee
*Attorney, Agent, or Firm*—Gary L. Griswold; Walter N. Kirn; Janice L. Dowdall

[57] ABSTRACT

The present invention provides a method of improving the vibrational damping characteristics of a circuit article. The method involves adding damping layer(s) to the laminate material that is processed into a circuit article. The damping material effectively increases the damping of the circuit article and reduces the amplitude of resonant frequencies of the circuit article excited by environmental vibrations or shocks that the circuit board may encounter in use and thereby potentially improving the performance of the circuit article for vibration and shock related performance issues without the addition of add-on dampers to the circuit articles surface or by isolating the circuit board by means of vibration and shock isolators.

37 Claims, 2 Drawing Sheets

INTERNALLY DAMPED CIRCUIT ARTICLES

FIELD OF THE INVENTION

The present invention relates to a method for internally damping a circuit article subject to resonant vibrations. More specifically, the present invention relates to a method of improving the damping properties of a wide variety of circuit articles by introducing a viscoelastic material as an inner layer(s) of the circuit article structure. The invention also relates to the internally damped circuit articles themselves.

BACKGROUND OF THE INVENTION

Periodic or random vibrations or shock can excite the resonant frequencies in a circuit article such as a circuit board, flexible circuit, etc. which can be problematic due to the resultant formation of undesirable stresses, displacements, fatigue, mechanical forces, and even sound radiation. Such undesirable vibrations or shocks are typically induced by external forces and can be experienced by a wide variety of circuit articles and under a variety of conditions. For example, printed circuit boards (PCBs) have the electrical traces laid-out upon or within a base substrate or laminate and typically have various components such as integrated circuit (I.C.) chips, resistors, capacitors, and the like, placed on and connected to these various electrical traces. Resonant vibrations can cause problems in circuit articles such as printed circuit boards (PCBs) and cards, etc., by significantly increasing the mechanical displacement of the base substrate or laminate, which may result in undesirable stresses and fatigue and subsequent premature circuit article failure.

Various techniques have been used to reduce vibrational and shock amplitude effects on circuit articles. Circuit articles such as circuit boards are typically protected from such shock or vibrations by a variety of methods such as (1) the addition of dampers to the exterior surface of the circuit article, i.e. "add-on dampers"; (2) by isolation of the circuit article or the structure in which it is used; and (3) by use of circuit article stiffeners. The use of these vibration and shock control methods can add significant cost and/or complexity to the structure in which the circuit article is incorporated.

Certain of these techniques, e.g. add-on dampers, utilize viscoelastic materials in exterior surface damping treatments for vibration and shock control. Two types of exterior surface damping treatments are commonly used: (a) free layer exterior damping treatment; and (b) constrained layer exterior damping treatment. Both of these exterior damping treatments can provide high levels of damping to a structure, i.e., dissipation of undesirable vibrations, without sacrificing the stiffness of the structure. Examples of such damping techniques are described, for example, in U.S. Pat. Nos. 2,819,032 (issued Jan. 7, 1953); 3,071,217 (issued Jan. 1, 1963); 3,078,969 (issued Feb. 26, 1963); 3,159,249 (issued Dec. 1, 1964); and 3,160,549 (issued Dec. 8, 1964).

As mentioned above, one method for controlling vibration is to isolate the circuit article from the vibration source. U.S. Pat. No. 4,053,943 (issued Oct. 11, 1977) describes a system for externally isolating a printed circuit board. Laminated damping elements are remotely positioned from and connected to the circuit board by post structural means fastened at each end to the circuit board and to the laminated damping element. Such an external isolation system adds to the overall size of the circuit board and may be impractical where close positioning of the circuit board to other structures is desired. Another isolation method is described WO 92/21178. By increasing the natural frequency of the circuit board, isolation can be achieved, again requiring complex design.

Free layer damping treatment is also referred to as "unconstrained layer" or "extensional damping" treatment. In this technique, damping occurs by applying a layer of viscoelastic damping material to an external surface of a structure. The material can be applied to one or both sides of a structure. The mechanism by which this treatment method dissipates undesirable energy, e.g., resonant vibrations, involves deformation. That is, when the structure is subjected to cyclic loading, for example, the damping material is subjected to tension-compression deformation and dissipates the energy through an extensional strain mechanism.

Constrained layer damping treatment is also referred to as "shear damping" treatment. For a given weight, this type of damping treatment is generally more efficient than the free layer damping treatment. In this technique, damping occurs by applying a damper consisting of one or more layers of viscoelastic damping material and one or more layers of a higher tensile modulus material to the external surface of a structure. That is, this damping technique is similar to the free layer damping treatment wherein a viscoelastic material is applied to an exposed surface of a structure, the difference being that the viscoelastic material is additionally constrained by a layer having a higher modulus than the viscoelastic material, e.g., a metal layer, in the constrained layer treatment. Energy dissipates from the viscoelastic damping material via a shear mechanism that results from constraints by the higher modulus constraining layer and the base structure.

Although these exterior surface damping techniques are used, the degree of damping is often times limited by thickness or spacing requirements, obstructions on the circuit article surface which limits application coverage, or accessibility or environmental limitations. For example, if the circuit article is desired to be a component in a size limited application, such as hard disk drives for portable computer systems, computers, calculators, pagers, cellular phones, etc. the ability to adequately damp the circuit articles by means of an "add-on" surface treatment damper or by isolating the circuit article within the structure may not be possible due to overall thickness requirements to meet space requirements or that the circuit article surface is nearly filled with components and a damper could not be added to the circuit article surface. Thus, an alternative approach is needed to damp vibrational or shock energy without adversely affecting the overall size or thickness of the circuit article or the structure incorporating the circuit article and by a process which is also cost effective.

SUMMARY OF THE INVENTION

The present invention provides an internally damped circuit article. A preferred circuit article contains at least one layer of damping material comprising a viscoelastic material, the damping material having a loss factor of at least about 0.01 and a storage modulus of at least about $6.9 \times 10^3$ Pascals.

The present invention also provides a method of improving the vibrational or shock damping characteristics of a circuit article. The method typically involves incorporating a vibration damping material into the circuit article structure typically prior to the addition of electrical circuit traces and circuit components (I.C. chips, resistors, etc.) and various processing steps (drilling, soldering, etc.) by adding a layer(s) of vibration damping material into the lay-up of the laminate (substrate) material from which the circuit articles are prepared. Depending upon the application, one continuous or a plurality of layers can be formed of one or more damping materials during the laminate or substrate build-up process. The damping material may be continuous throughout a layer or the layer may comprise different damping materials adjacent to each other or separated by either a space or a non-damping material.

The vibration damping material includes a viscoelastic material or blend of different viscoelastic materials. Useful viscoelastic materials are those having a storage modulus of at least about 1 psi (6.9×10$^3$ Pascals) and a loss factor of at least about 0.01 at the operating temperature and frequency of the article. Advantageously and preferably, a layer of the vibration damping material is placed in the interior of a circuit article typically in the form of one or more layers such that the added damping layer increases the vibrational damping, as measured by the system loss factor, i.e., the loss factor of the article in which the vibration damping material is incorporated, of the circuit article or the structural material of which it is made is increased by at least about 10% in at least one vibrational mode. System loss factor is a measure of the damping in a structure.

The viscoelastic damping material useful in the invention can be a thermoplastic polymer or a thermoset polymer. Preferably, the viscoelastic damping material is a thermoset type polymer, such as an acrylate.

In certain preferred embodiments, the vibration damping material also includes an effective amount of a fibrous material. The vibration damping material preferably includes an amount of fibrous material effective to improve vibration damping of the article or the structural material of which the article is made by a factor of at least about two in strain energy ratio and in at least one vibrational mode. Typically, this requires incorporating about 3–60 wt% of the fibrous material into the vibration damping material, based on the total weight of the vibration damping material. Preferably, the fibrous material is a nonmetallic fibrous material, such as glass.

In another preferred embodiment, the vibration damping material also includes an effective amount of a particulate material. The vibration damping material preferably includes an amount of particulate material effective to improve vibrational damping of the article or the structural material of which the article is made by a factor of at least about two in strain energy ratio and in at least one vibrational mode. Typically, this requires incorporating about 0.5–70 wt% of the particulate material into the vibration damping material, based on the total weight of the vibration damping material. Preferably, the particulate material is a non-electrically conducting material, such as glass or aluminum oxide, or an electrically conducting material that conducts only in a single direction such that electrical connection can be achieved between layers of a circuit board without electrical cross talk to nearby electrical traces or connections not designed as a connection with other traces.

Additionally, in certain preferred embodiments, the vibration damping material that provides the significant portion of the damping for a given material layer also includes an effective amount of an epoxy resin (with or without the particulate and/or fibrous material) dispersed within the damping material. The vibration damping material can comprise a blend of different vibration damping materials each having optimal damping properties over different temperature ranges to improve the damping temperature range of the blend. The vibration damping material preferably includes an amount of epoxy resin effective to improve damping properties by providing damping over a wider temperature range, and improve the integrity of the circuit article or the structural material of which the circuit article is made. An example of a suitable damping material incorporating an epoxy resin is disclosed in U.S. Pat. No. 5,262,232 (issued Nov. 13, 1993) and hereby incorporated herein by reference. Thus, the vibration damping material may further comprise an epoxy resin material which may optionally have vibration damping properties. Typically the amount of epoxy resin incorporated into the vibration damping material is about 0.5 to about 95 weight percent, preferably about 5 to about 50 weight percent based upon the total weight of the vibration damping material.

The term "circuit article" as used herein includes circuit boards, flexible circuits, etc. Types of circuit boards include but are not limited to graphic circuit boards (multilayer boards, double sided boards, and single sided boards) and discrete wire boards. Circuit boards can be classified as rigid, flexible, or semi-flexible. The term "circuit board" as used herein also includes circuit cards. The term "flexible circuits" as used herein includes flexible connectors, flexible circuits having components therein (such as resistors, capacitors, etc.), etc. Additional information regarding circuit articles can be found in the reference entitled Printed Circuit Handbook, Third Edition, Clyde F. Coombs, Jr. McGraw-Hill Book Co., New York, 1988, ISBN 0-07-012609-7.

DETAILED DESCRIPTION OF THE INVENTION

Figure 1:
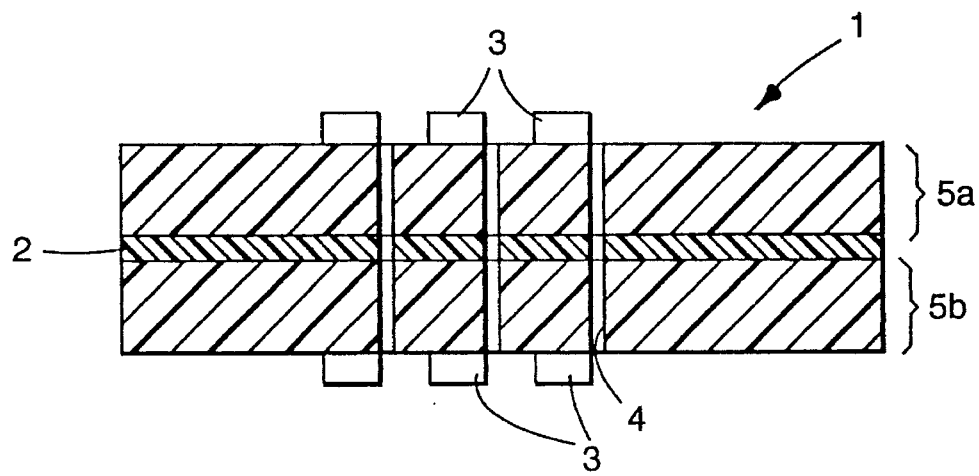
FIG. 1 is a schematic of one embodiment of the present invention showing the cross-section of a circuit board having a continuous single layer of a vibrational damping material placed near the center of the circuit board's thickness.

The present invention provides a method of improving damping properties of a circuit article and thereby solving vibration problems in a variety of applications where circuit articles are exposed to vibration or shock. More specifically, the present invention provides a vibration and shock resistant damped circuit article that uses a dissipative damping material, with a loss factor of at least about 0.01, preferably at least about 0.1. This damping material, when placed in areas of strain in the circuit article inner layers, can be exposed to significant amounts of strain energy in various vibrational modes of interest and dissipates this vibrational energy as heat, thereby diminishing vibration and shock displacement oscillations. The present invention can be applied to damp, i.e., reduce the vibrational or shock amplitude or duration of, a wide variety of vibrational modes, e.g., bending, torsion, sway, and extensional/compression modes, in a wide variety of circuit article designs and over a wide frequency and temperature range. It can be applied to situations in which surface treatments, such as constrained layer treatments and isolation structures to hold the circuit article are typically used.

The method of the present invention involves the incorporation of a vibration damping material as one or more layers of the circuit article construction. A circuit article, for example, is the structure made when various layers of metal, e.g. copper, etc. and resin coated fibers, e.g. resin coated glass fibers, etc., are layered upon each other in various thicknesses and then heated under pressure to make the "laminate" structure that the final circuit board is built into and onto. The manufacture of a circuit board can start with the making of the laminate, i.e., layers of metal and resin coated fibers, and then employing various processes, e.g., drilling, plating, etching, soldering, etc., to add features and electrical components to the laminate to create the final circuit article. The vibration damping material is layered onto the metal or resin coated fibers during the build-up of the laminate structure of the circuit board. Preferably, the damping material is laminated, sprayed, silk screened, or cast onto the layers of the resin/fiber structural material or metal layers.

A vibration damping layer may be continuous or discontinuous. A continuous vibration damping layer may comprise one type of damping material or may comprise adjacent sections of different vibration damping materials, for example. A discontinuous layer may comprise sections of damping material separated by non-damping material(s) or space(s) for example. In addition when at least 2 damping layers are present each layer may comprise the same or different damping material(s).

The damping material could potentially be used to replace all or part of the resin used for the preparation of the resin coated reinforcement fiber material. This damping material coated reinforcement fiber material could then be used in place of the resin coated reinforcement material in the build-up of the circuit article laminate.

The final circuit article design can have the damping material encased around the edges using metal or plastic or sealed with adhesive, tape, or by sonic bonding or the like so that the damping material is substantially completely surrounded by, i.e., encased or enclosed within, the structural material. Alternately, the damping material can be exposed at the perimeter edges or cut-outs within the design of the circuit article. The addition of the damping polymer into the laminate structure results in creating an inherently damped circuit article laminate material that when optionally further processed by drilling holes, plating electrical circuits and adding electronic components (integrated circuit chips, resistors, etc.) results in a vibration and shock resistant circuit article, without the addition of a separate add-on damper or without placing the circuit article in a vibration and shock resistant enclosure or structure.

Preferably, the damped article is substantially covered within a continuous layer(s) with a damping material, although the layer(s) may be discontinuous. Typically, an amount of the damping material is placed as an inner laminate layer to improve the damping characteristics of the circuit article. Preferably, a sufficient amount of the vibration damping material is used such that the damping of the circuit article or the structural material of which it is made is improved by at least about 10% in at least one vibrational mode. As a result of this technique, high mechanical strains are introduced into the damping material when the structure is excited at one or more of its natural frequencies. The resulting mechanical strain energy in the damping material is then dissipated in the form of heat. The higher the strain energy in the damping material, the more vibration energy is dissipated from the circuit article structure.

The placement of a partial layer of damping material in the circuit article can be influenced by the location of the plated through holes (in the case of a circuit board, for example) and if the circuit article edges are sealed. The plated through holes and edge condition of the circuit article can alter the stiffness of the circuit article and determine areas of greater vibrational activity for a given vibrational or shock excitation of one of the modes of vibration in a certain area of the circuit article. That is, the partial vibration damping material layer(s) is placed in the circuit article where one or more vibrational modes are active. By such placement, the amount of strain energy that is generated in the damping material used for the circuit article can be maximized. The identification of these locations can be determined by one of skill in the art using modal analysis or finite element analysis.

The circuit article's laminate structure damped by the method of the present invention can be prepared from any material suitable for circuit article designs. Useful materials include, for example, resins such as epoxies, polyesters and phenolics, and reinforcements of the resins by materials such as cotton paper, woven glass, mat glass and glass veil, metals, e.g. copper layers and various flexible materials such as polyimides, polyesters, etc. depending on the circuit article design. The resin themselves may contain vibration damping material, typically about 0.5 to about 95 weight percent. Additional additives such as flame retardants, antioxidants, and colorants can also be added to the materials of the structure.

The vibration damping material can include any material that is viscoelastic. A viscoelastic material is one that is viscous, and therefore capable of dissipating energy, yet exhibits certain elastic properties, and therefore capable of storing energy at the desired temperature and frequency range. That is, a viscoelastic material is an elastomeric material typically containing long-chain molecules that can convert mechanical energy into heat when they are deformed. Such a material typically can be deformed, e.g., stretched, by an applied load and gradually regain its original shape, e.g., contract, sometime after the load has been removed.

Suitable viscoelastic materials for use in the vibration damping materials of the present invention have a storage modulus, i.e., measure of the energy stored during deformation, of at least about 1 psi ($6.9 \times 10^3$ Pascals) at the operating temperature and frequency (typically about −40 to 150° C. and about 1 to 10,000 Hz). The storage modulus of useful viscoelastic materials can be as high as 500,000 psi ($3.45 \times 10^9$ Pascals); however, typically it is about 10–2000 psi ($6.9 \times 10^4$–$1.4 \times 10^7$ Pascals). Particularly preferred viscoelastic materials provide the structure, i.e. the damped circuit article, with a strain energy ratio, i.e., fraction of strain energy stored in the damping material relative to the total strain energy stored in the structure, of at least about 2%.

Suitable viscoelastic materials, at the operating temperature and frequency, for use in the vibration damping materials of the present invention have a loss factor, i.e., the ratio of energy loss to energy stored, of at least about 0.01. Preferably the loss factor is at least about 0.1, more preferably about 0.5–10, and most preferably about 1–10, at the operating frequency and temperature experienced by the material. This loss factor represents a measure of the energy dissipation of the material and depends on the frequency and temperature experienced by the damping material. For example, for a crosslinked acrylic polymer, at a frequency of 100 Hz, the loss factor at 68° F. (20° C.) is about 1.0, while at 158° F. (70° C.) the loss factor is about 0.7.

Preferred viscoelastic materials are those that remain functional over a wide range of temperatures, e.g., −40° F. (−40° C.) to 300° F. (149° C.). Most preferred viscoelastic materials are those that cover the broadest temperature and frequency range at the desired minimum loss factor and storage modulus to achieve acceptable damping of the circuit article and which do not experience a significant degradation in properties due to long times at high temperatures or short excursions beyond these high temperature levels.

Useful viscoelastic damping materials can be isotropic as well as anisotropic materials, particularly with respect to its elastic properties. As used herein, an "anisotropic material" or "nonisotropic material" is one in which the properties are dependent upon the direction of measurement. Suitable viscoelastic materials include urethane rubbers, silicone rubbers, nitrile rubbers, butyl rubbers, acrylic rubbers, natural rubbers, styrenebutadiene rubbers, and the like. Other useful damping viscoelastic materials include polyesters, polyurethanes, polyamides, ethylene-vinyl acetate copolymers, polyvinyl butyral, polyvinyl butyralpolyvinyl acetate copolymers, epoxy-acrylate interpenetrating networks and the like. Specific examples of useful materials are disclosed or referenced in U.S. Pat. No. 5,183,863 (issued Feb. 2, 1993), U.S. Pat. No. 5,262,232 (issued Nov. 16, 1993), and U.S. Pat. No. 5,308,887 (issued May 3, 1994), which are incorporated herein by reference.

Examples of thermoplastic materials suitable for use as the vibration damping material in circuit articles according to the present invention include, but are not limited to, those selected from the group consisting of polyacrylates, polycarbonates, polyetherimides, polyesters, polysulfones, polystyrenes, acrylonitrile-butadiene-styrene block copolymers, polypropylenes, acetal polymers, polyamides, polyvinyl chlorides, polyethylenes, polyurethanes, and combinations thereof.

Useful viscoelastic materials can also be crosslinkable to enhance their strength and processability. Such viscoelastics are classified as thermosetting resins. When the viscoelastic material is a thermosetting resin, then prior to the manufacture of the circuit article damped laminate, the thermosetting resin is in a thermoplastic state. During the manufacturing process, the thermosetting resin can be further cured and/or crosslinked typically to a solid state, although it could be a gel upon curing as long as the cured material possesses the viscoelastic properties described above. Depending upon the particular thermosetting resin employed, the thermosetting resin can include a curing agent, e.g., catalyst, which when exposed to an appropriate energy source (such as thermal energy) the curing agent initiates the polymerization of the thermosetting resin. Particularly preferred viscoelastic damping materials are those based on acrylates.

In general, any suitable viscoelastic material can be used. The choice of viscoelastic material for a particular set of conditions, e.g., temperature and frequency of vibration, etc., is within the knowledge of one of skill in the art of viscoelastic damping. The selection of a suitable damping material is also based on the processability of the damping material into a damped laminate circuit article (drilling, etching, plating, etc.) and the desired structural integrity of the finished circuit article construction with the damping material selected. It is to be understood that blends of any of the foregoing materials can also be used.

In addition to the viscoelastic material, the vibration damping material of certain preferred embodiments of the present invention includes an effective amount of a fibrous and/or particulate material. Herein, an "effective amount" of a fibrous material and/or particulate is an amount sufficient to impart at least improvement in desirable characteristics to the viscoelastic material, but not so much as to give rise to any significant detrimental effect on the structural or electrical integrity of the circuit article in which the viscoelastic material is incorporated. Generally, the fibrous and/or particulate material is used in an amount effective to increase the strain energy ratio of a component containing the same amount and type of viscoelastic material without the fibrous or particulate material. Generally, an increase in the strain energy ratio of a factor of at least about two in at least one vibrational mode is desired. Typically, the amount of the fibrous material in the viscoelastic material is within a range of about 3–60 wt%, preferably about 10–50 wt%, more preferably about 15–45 wt%, and most preferably about 20–40 wt%, based on the total weight of the vibration damping material. Typically, the amount of the particulate material in the viscoelastic material is within a range of about 0.5–70 wt% preferably about 1–45 wt%, more preferably about 5–40 wt%, and most preferably about 5–30 wt%, based on the total weight of the vibration damping material.

The fibrous material can be in the form of fibrous strands or in the form of a fiber mat or web, although fibrous strands are preferred. The fibrous strands can be in the form of threads, cords, yarns, rovings, filaments, etc., as long as the viscoelastic can wet the surface of the material. They can be dispersed randomly or uniformly in a specified order. Preferably, the fibrous strands, i.e., fibers or fine threadlike pieces, have an aspect ratio of at least about 2:1, and more preferably an aspect ratio within a range of about 2:1 to about 10:1. The aspect ratio of a fiber is the ratio of the longer dimension of the fiber to the shorter dimension.

The fibrous material can be composed of any material that increases the damping capability of the viscoelastic material. Examples of useful fibrous materials in applications of the present invention include metallic fibrous materials, such as aluminum oxide, magnesium, or steel fibers, as well as nonmetallic fibrous materials, such as fiberglass. Generally, high Young's modulus fibrous materials, i.e., those having a modulus of at least about 1,000,000 psi ($6.9 \times 10^9$ pascals), are preferred. Most preferably, the fibrous material is nonmetallic. The nonmetallic fibrous materials can be a variety of materials, including, but not limited to, those selected from the group consisting of glass, carbon, minerals, synthetic or natural heat resistant organic materials, and ceramic materials. Preferred fibrous materials for circuit articles of the present invention are organic materials, glass, and ceramic fibrous material.

By "heat resistant" organic fibrous material, it is meant that useable organic materials should be sufficiently resistant to melting, or otherwise softening or breaking down, under the conditions of manufacture and use of the circuit article of the present invention. Useful natural organic fibrous materials include, but are not limited to, those selected from the group consisting of wool, silk, cotton, and cellulose. Examples of useful synthetic organic fibrous materials include, but are not limited to, those selected from the group consisting of polyvinyl alcohol, nylon, polyester, rayon, polyamide, acrylic, polyolefin, aramid, and phenol. The preferred organic fibrous material for applications of the present invention is aramid fibrous material. Such a material is commercially available from Dupont Co., Wilmington, Del. under the trade names of "Kevlar" and "Nomex."

Generally, any ceramic fibrous material is useful in applications of the present invention. An example of a ceramic fibrous material suitable for the present invention is NEXTEL™ which is commercially available from Minnesota Mining and Manufacturing Co., St. Paul, Minn. Examples of useful, commercially available, glass fibrous material are those available from PPG Industries, Inc. Pittsburgh, Pa., under the product name E-glass bobbin yarn; Owens Corning, Toledo, Ohio, under the product name "Fiberglass" continuous filament yarn; and Manville Corporation, Toledo, Ohio, under the product name "Star Rov 502" fiberglass roving.

Advantages can be obtained through use of fibrous materials of a length as short as about 100 micrometers. The fibers are not limited in length but much longer fibers may provide insufficient fiber interface and therefore decreased shearing surfaces between fibers. The fiber thickness or diameter for typical fibrous material ranges from about at least 5 micrometers. The thinner the fiber, the higher the surface area of the fibrous material. Thus, preferred fibrous materials are very thin. The thickness of the fiber is also dependent upon the desired thickness of the overall damping material layer that will be used in the circuit article. Thus, many common fibers may not be suitable if the overall damping material thickness is relatively thin (e.g., 0.005 mm to 0.010 mm).

The particulate material useful in the invention can be in the form of nodules, bubbles, beads, flakes, or powder, as long as the viscoelastic can wet the surface of the material. The particulate material can vary in size, but should not typically be greater than the thickness of the damping material layer. Preferably, the particulate material is on the size order of about 0.1 to about 5 micrometers and more preferably about 0.1 to about 2 micrometers.

The particulate material can be composed of any material that increases the damping capability of the viscoelastic damping material and does not negatively affect the electrical properties of the laminate, i.e., allow a non desired circuit path or significantly impact mechanical strength of the circuit article laminate, e.g., delamination, interlaminar bond strength, or machinability of the laminate, e.g., drilling holes.

The addition of fiber or particulate to the damping material may also have the potential effect of increasing interlaminar strength between the reinforced resin layers of the laminate and the damping layers by providing high surface energy surfaces to bond to for the resin material. The exposed surfaces of the fibers and particulates are also set into the damping material layer and could provide anchoring for greater bond strength.

Examples of useful particulate materials in applications of the present invention include but are not limited to coated or uncoated glass and ceramic bubbles or beads such as thermally conductive bubbles, powders such as aluminum oxide powder and aluminum nitride powder, silica, metal flakes such as copper flakes, cured epoxy nodules, and the like, i.e., those having a modulus of at least about 10,000 psi ($6.9 \times 10^7$ pascals), are preferred. More preferably, useful particulate materials have a Young's modulus of about 100,000 psi ($6.9 \times 10^8$ pascals), and most preferable are those with a modulus of at least 1,000,000 psi ($6.9 \times 10^9$ pascals).

In addition to fibers and particulate material, the vibration damping material of the present invention can include additives such as fillers (e.g. talc, etc.), colorants, toughening agents, fire retardants, antioxidants, antistatic agents, and the like. Sufficient amounts of each of these materials can be used to effect the desired result.

Combinations of fibrous material and particulate material would also be useful and would be used in the range of about 0.5 to about 70 weight percent based on the total weight of the vibration damping material.

The damped circuit article of the invention utilize the damping of viscoelastic materials with a minimum impact on the circuit articles structural geometry and stiffness as required for a given end use application. Thus, the damped circuit articles of the present invention are good candidates for new or old products that require added vibration and shock resistance over non-damped circuit articles. In addition, where damping is needed, the damped laminate circuit article provides for tighter geometry designs, lower weight applications as damped circuit articles may not need add-on dampers and other types of shock and vibration isolation designs. Thinner circuit articles may also be possible, as the addition of damping to an inner layer(s) of the laminate could allow for thinner circuit articles by providing added damping and reducing the need for added stiffness, add-on dampers, or mass as is required in past designs to help reduce the effects of vibrations or shock.

The internally damped circuit article of the present invention will be better understood by reference to the following FIGS. 1–6.

FIG. 1 is a schematic of one embodiment of the present invention showing a cross section of a circuit board 1 having a continuous single layer of a damping material 2. The circuit board 1 has electrical components 3 attached to both outer surfaces. Viscoelastic damping layer 2 is centrally positioned within the circuit board 1. Throughholes 4 are positioned therein. The multiple standard layers of the circuit board are identified as 5a and 5b. The multiple standard layers 5a and likewise 5b may include, for example, the following layers: epoxy resin layer(s) (to achieve the desired overall stiffness), electrical trace layer(s) (horizontally placed), polyimide layers, etc., and combinations thereof. One skilled in the art would be able to appropriately select these conventional standard layers for a particular application.

Figure 2:
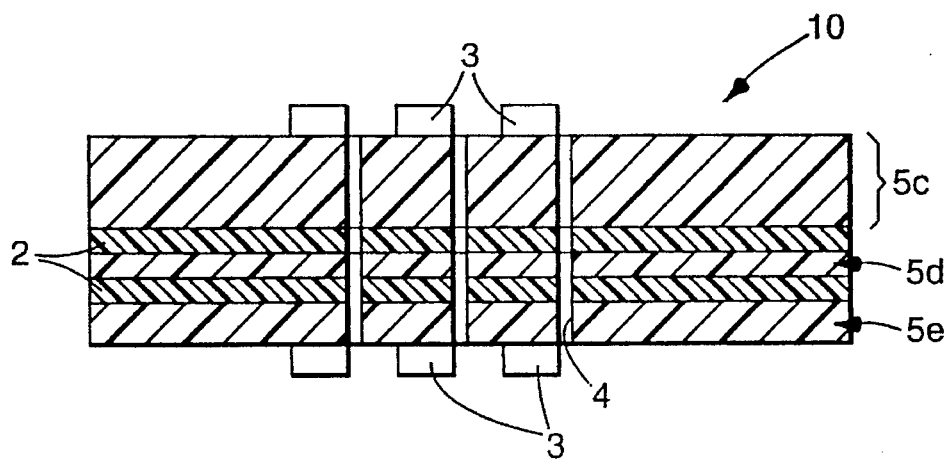
FIG. 2 is a schematic of an alternative embodiment of the present invention showing a cross-section of a portion of a circuit board having two layers of damping material.

FIG. 2 is a schematic of one embodiment of the present invention showing a cross section of a circuit board 10 having two continuous single layers of a damping material 2. The board contains electrical components 3, throughholes 4, and multiple standard layers 5c, 5d, 5e.

Figure 3:
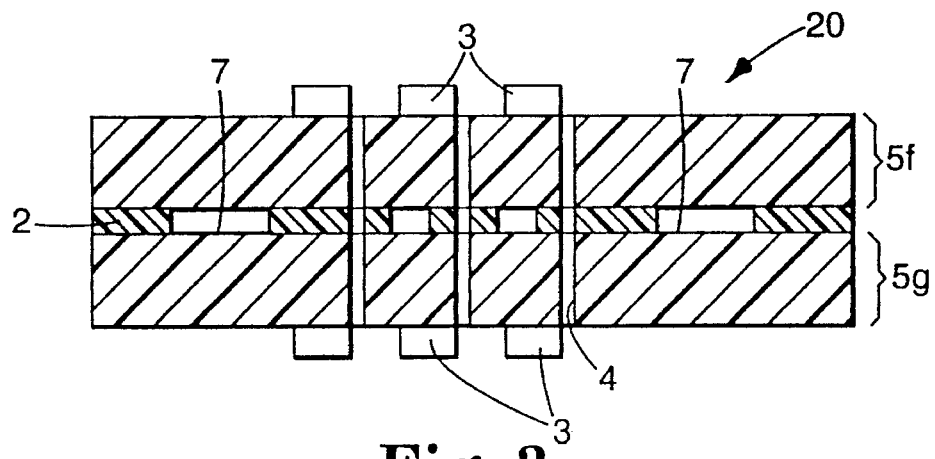
FIG. 3 is a schematic of an alternative embodiment of the present invention showing a cross-section of a circuit board having a single non-continuous layer of a damping material.

FIG. 3 is a schematic of one embodiment of the present invention showing a cross section of a circuit board 20 having a single non-continuous layer of a damping material 2. The layer of damping material 2 is separated by spaces 7. The board 20 contains electrical components 3, throughholes 4, and multiple standard layers 5f and 5g.

Figure 4:
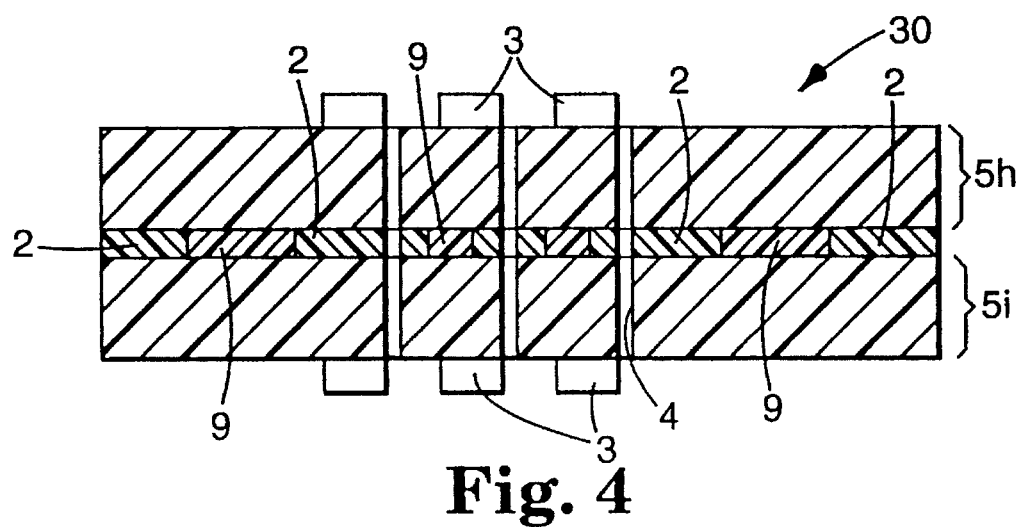
FIG. 4 is a schematic of an alternative embodiment of the present invention showing a cross-section of a circuit board having a single continuous layer of a damping material comprising adjacent sections of two different damping materials.

FIG. 4 is a schematic of an alternative embodiment of the present invention showing a cross-section of a circuit board 30 having a single continuous layer of damping material comprising adjacent sections of damping material 2 and a different vibration damping material 9. The board 30 contains electrical components 3, throughholes 4, and multiple standard layers 5h and 5i.

Figure 5:
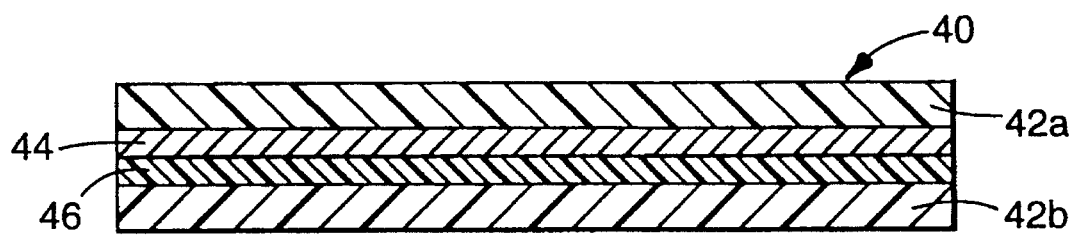
FIG. 5 is a schematic of another embodiment of the present invention showing a cross-section of a flexible circuit having a single continuous layer of a damping material.

FIG. 5 is a cross-section of a flexible circuit 40 comprising upper substrate layer 42a which may comprise a protective film such as a polyimide cover film, for example, lower substrate layer 42b which may comprise a second polyimide cover film, for example, a single continuous layer of damping material 46, and an electrical trace layer 44 which may comprise lines of copper, for example.

Figure 6:
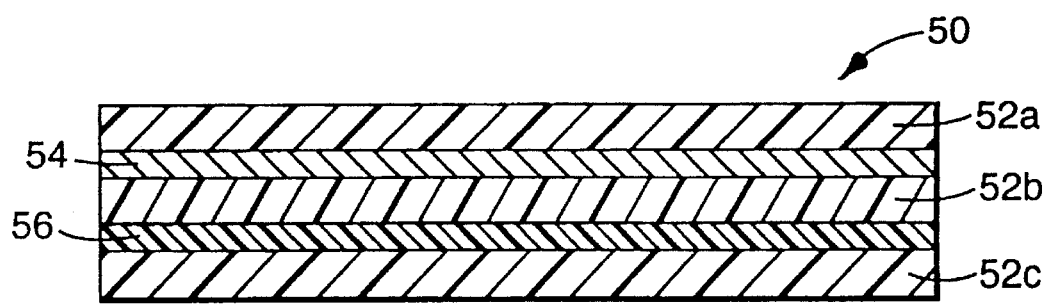
FIG. 6 is a schematic of another embodiment of the present invention showing a flexible circuit having two continuous layers of damping material.

FIG. 6 is a cross-section of a flexible circuit 50 comprising upper substrate layer 52a, middle substrate layer 52b, and lower substrate layer 52c. An electrical trace layer 54 is situated between upper substrate layer 52a and middle substrate layer 52b. A single continuous layer of damping material 56 is situated between middle substrate layer 52b and lower substrate layer 52c.

One method for adding the damping material to the circuit article is to add the damping material as a separate/discrete layer during the laminate build up process. An alternate means may be to add the damping material to the resin material (such as an epoxy or phenolic, etc. for example) of the laminate and reduce the usage of resin material. Those skilled in the art can select the best means to introduce the damping material into a specific process based on the needs of the final damped laminate circuit article and also limitations in processing capabilities of the laminate input materials.

The following laminating process is meant to be illustrative as a process for adding damping material into the laminate of the circuit article and is not meant to limit the ways that a damping material could be introduced into the circuit article.

In the generic build-up for a circuit article such as a circuit board, layers of resin, resin coated fibers, and metal are layered together in various stages of the cure of the resin. For a generic process, partially cured resin material is called "B-stage" material. Many texts are available that describe in detail the lamination process and circuit board manufacture, such as: *Printed Circuits Handbook, Third Edition*, Clyde F. Coombs, Jr., McGraw-Hill Book Company, New York, 1988, ISBN 0-07-012609-7, incorporated by reference herein, which offer good insight into the circuit board manufacturing process.

The damping of circuit articles also encompasses the damping of flexible circuits, that, as noted earlier, can also benefit from the addition of damping. Flexible circuits may be similar in design concept to rigid or semi-rigid circuit boards, but often their main function is to act as interconnects between rigid circuit boards and other electrical components that require a flexible circuit connection. Flexible circuits typically comprise layer(s) of a polyimide or polyester film, an electrically conductive material (such as copper, etc.) and bonding materials or adhesive systems such as polyester adhesives. Examples of these flexible circuits are also found in *Printed Circuits Handbook, Third Edition*, Clyde F. Coombs, Jr., McGraw-Hill Book Company, New York, 1988, ISBN 0-07-012609-7, ch. 35, incorporated by reference herein. An example of a flexible circuit application is in disk drives. A flexible circuit connects to the disk drive accuator (accuator pivots back and forth around a spindle) and may require significant flexing and movement and lead to excitation of the flexible circuit resonant frequencies. Damping the flexible circuit can reduce the amplitude and energy in resonant frequencies excited in the circuit, thus improving the performance of the accuator or moving system and of the flexible circuit. Other examples of applications for flexible circuits are as circuits for automobiles, computers, airplanes, etc. By damping the flexible circuit, the resonant vibrations are reduced in these applications which could potentially increase the life of the flexible circuit and thus improve its reliability and performance and also potentially increase the life of connection sites it is attached to, along with minimizing the flexible circuit's impact on systems it is connected to.

Circuit Board Preparation Process

The following is an outline for a process which may be used to prepare a rigid circuit board of the invention.

Prepreg Material Preparation

1) Mix the resin and desired chemical additives (e.g. flame retardant, etc.)

2) Coat or impregnate the reinforcement materials (glass, etc.) with the resin.

3) Polymerize the resin coated or impregnated reinforcement material into a "B-Stage" (e.g. semicure of resin) to form the "prepreg" material.

Laminate Build-up

1) Layer into the laminator press the initial desired layer (typically copper foil).

2) Layer in the desired number of prepreg layers to fit design needs.

3) Layer in damping material (sheets, spray, etc.)

4) Layer in additional layers of prepreg and additional layers of damping material (if desired).

5) Add final prepreg layer and final foil layer if desired.

Laminate Curing

1) Load the damped prepreg into a press that applies heat and pressure.

2) Apply heat and pressure until the resin is fully cured.

Cured Damped Laminate Processing

1) The damped laminate material may be further processed into various types of circuit boards or articles by various processing steps such as drilling, plating through holes, print and etching, soldering, etc., to achieve the desired final damped circuit design.

As described above, the vibrational damping material can include a viscoelastic material or a combination of viscoelastic material with a fibrous and/or particulate material. It is to be understood that the vibration damping material can include a blend of viscoelastic materials as well as a variety of different fibrous or particulate materials or their combinations. The desired thickness of the damping material is typically 0.005 mm to 0.51 mm (0.0002 inch to 0.020 inch); preferably, 0.013 mm to 0.13 mm (0.0005 inch to 0.005 inch); and most preferably, 0.018 mm to 0.038 mm (0.0007–0.0015 inch). It is possible that the entire laminate could incorporate damping material as a replacement for the resin or as a blend or interpenetrating network (IPN) with resin, thus giving an essentially full thickness damped laminate material for the circuit board construction.

When the circuit article of the invention contains a single layer of vibration damping material, preferably the layer is positioned within the article at a distance of at least about 5%, more preferably at least about 30%, of the thickness of the article from an upper and lower exterior surface of the article. Most preferably, when the circuit article has one layer of damping material the layer is positioned equidistant from an upper exterior surface of the article and a lower exterior surface of the article. When the circuit article of the invention contains at least two layers of vibration damping material, preferably each damping material layer is positioned within the article such that it is at least about 5% of the thickness of the article away from an upper and lower exterior surface of the article and each vibration damping material layer is at least about 5%, more preferably at least about 20%, most preferably at least about 30%, of the thickness of the article away from another vibration damping layer.

The circuit board of the present invention can be prepared by any suitable method for fabricating circuit boards as understood by those in the industry. These techniques are well known to those of skill in the art. For example, a damped circuit board can be made by adding a single layer of a damping material 0.025 mm (1-mil) thick near the center of a prepreg build-up using standard prepreg build-up techniques and processing the prepreg in the same manner as a non-damped prepreg. The finished damped circuit board will advantageously have increased damping over the non-damped circuit board of the same process.

EXAMPLES

The invention has been described with reference to various specific and preferred embodiments and will be further described by reference to the following detailed examples. It is understood, however, that there are many extensions, variations, and modifications on the basic theme of the present invention beyond that shown in the examples and detailed description, which are within the spirit and scope of the present invention. All parts, percentages, ratios, etc. in the Examples and the specification are by weight unless indicated otherwise.

Example 1 and 2

In order to verify the performance of an internally damped circuit board, sample boards were prepared by adding 1 or 2 layers of a 0.025 mm (1-mil) damping material into the laminate build-up, to prepare the damped circuit articles of Examples 1 and 2 respectively.
Description of Sample For the purpose of demonstrating the invention, an acrylic damping material was used in an FR-4 type circuit board buildup. The FR-4 laminate construction incorporated a single layer of damping material for Example 1 and two layers of damping material for Example 2. The damping material used was an acrylic polymer that had a loss factor greater than 0.5 for a broad frequency range (±1000 Hz) at the desired test temperature (20° C./72° F.). The damping polymer selected was 3M Scotchdamp™ ISD-112, SJ2015 type 1201 available from Minnesota Mining and Manufacturing Company, St. Paul, Minn.).

Example 1

Single Layer Design:
During the laminate build-up process, 0.025 mm (1 mil) thick 3M Scotchdamp™ ISD-112 SJ2015 type 1201 was positioned in a continuous sheet layer approximately 0.56 mm (22 mils) from the laminate surface of an approximately 1.4 mm (56 mils) total laminate thickness. The FR-4 laminate was fully cured and further processed to add plated through holes and circuit lines in addition to a metal layer on the perimeter of the circuit board laminate.

Example 2

Two Layer Design:
0.025 mm (1 mil) thick 3M Scotchdamp(™) ISD-112 SJ2015 type 1201 was placed in two continuous sheet layers at a distance/position approximately 0.56 mm (22 mils) and 0.94 mm (37 mils) from the exterior surface of an approximately 1.4 mm (56 mils) total laminate thickness. The FR-4 laminate was fully cured and further processed to add plated through holes and circuit lines in addition to a metal layer on the perimeter of the circuit board laminate.

Comparative Example 3

Non-damped design:
Same design as Example 1 single layer design, but without a damping layer.
Testing of Circuit Boards The basis of the circuit board damping testing was a circuit board design with plated through holes and circuit lines wherein the perimeter edges were metal coated. All three design samples were the same, except for the addition of the damping material layers. The dimensions of the boards were approximately 135 cm×88 cm×0.022 cm. The benefit of the added damping layers was determined by means of a modal or damping analysis of specific resonant frequencies of the circuit board that could be excited by an external source. The "damping" (ability to dissipate mechanical energy) of the circuit board was determined by measuring the system loss factor at several resonant frequencies.

The Examples 1 and 2 and the Comparative Example 3 circuit boards as prepared above were tested in the following manner:

The circuit board design to be tested for the level of damping in the circuit board was clamped down to a solid support along one of the 88 cm edges, with the other edge free. An accelerometer probe was placed on the upper surface of the free edge of the circuit board and the circuit board was subjected to excitation that caused the resonant frequencies of the board to be excited. The "damping analysis" is the measurement of the transfer function (ratio of acceleration out at the accelerometer per unit of force in the frequency domain from the excitation source). Note: a magnetic transducer that could excite the circuit board by bonding a small piece of steel to the circuit board was used. By using a FFT analyzer, the output analysis reveals significant increases in amplitudes at certain frequencies excited in the circuit board. These are the resonant frequencies of the circuit board, and the amplitudes that will be reduced by the addition of the damping layers.

The measurement of the damping is determined by calculating the system loss factor for the circuit board design at the desired resonant frequency. The "system loss factor" is defined as: the width (Hz) of the resonant peak at 3 db below the resonant frequency of peak amplitude/the resonant frequency (Hz) at peak amplitude. Normalized loss factor for each example was calculated by dividing the loss factor for each example by the loss factor of Comparative Ex. 3 in order to more clearly show the magnitude of benefits obtained by including an internal damping layer(s) in the article of the present invention.

Results are reported in Table I below.

TABLE I

| | Normalized System Loss Factor At Resonant Frequency (HZ) | | | |
|---|---|---|---|---|
| Example | 450 | 775 | 1175 | 2400 |
| Comparative 3 | 1.0[1] | 1.0[1] | 1.0[1] | 1.0[1] |
| 1 | 2.1[2] | 2.2[2] | 3.3[2] | — |
| 2 | 2.3[3] | 3.2[3] | — | 3.9[3] |

TABLE I-continued

| | Normalized System Loss Factor At Resonant Frequency (HZ) | | | |
|---|---|---|---|---|
| Example | 450 | 775 | 1175 | 2400 |

[1]System loss factor of Comp. Ex. 3 ÷ system loss factor of Comp. Ex. 3 at same resonant frequency
[2]System loss factor of Ex. 1 ÷ system loss factor of Comp. Ex. 3 at same resonant frequency
[3]System loss factor of Ex. 2 ÷ system loss factor of Comp. Ex. 3 at same resonant frequency The data in Table 1 shows the increase in damping by the addition of damping layer(s) to the circuit board design over a non-damped circuit board. The data also shows that the damping of the circuit board of the invention for a given resonant frequency was increased by a factor of as large as 2.1 to 3.9. The increase in damping is significant and the damping is added across a broad frequency range.

The foregoing detailed description and examples have been given for clarity of understanding only. No unnecessary limitations are to be understood therefrom. The invention is not limited to the exact details shown and described, for variations obvious to one skilled in the art will be included within the invention defined by the claims. Varying internally damped circuit article designs may also provide for better damping results that are shown by the above example.

What is claimed is:

1. An internally damped circuit article comprising:
   (a) a circuit article laminate structure; and
   (b) vibration damping material, wherein the vibration damping material is incorporated into the circuit article laminate structure.

2. The circuit article of claim 1 containing at least one vibration damping layer comprising a reinforcement fiber material at least partially coated or impregnated with a vibration damping material.

3. A circuit article containing at least one layer of a vibration damping material comprising a viscoelastic material, said vibration damping material having a loss factor of at least about 0.01 and a storage modulus of at least about $6.9 \times 10^3$ Pascals.

4. The circuit article of claim 1 selected from the group consisting of circuit boards and flexible circuits.

5. The circuit article of claim 1 selected from the group consisting of circuit boards.

6. The circuit article of claim 1 wherein the vibration damping material is placed in the circuit article where one or more vibrational modes are active.

7. The circuit article of claim 3 wherein said vibration damping material has a loss factor greater than about 0.1 and a loss modulus of at least about $6.9 \times 10^4$ Pascals.

8. The circuit article of claim 3 wherein said vibration damping material has a loss factor of about 0.5 to about 10 and a storage modulus of about $6.9 \times 10^4$ to about $1.4 \times 10^7$ Pascals.

9. The circuit article of claim 3 wherein said circuit article contains at least two layers of vibration damping material.

10. The circuit article of claim 3 wherein the vibration damping material layer(s) each has a thickness of about 0.005 to about 0.51 mm.

11. The circuit article of claim 3 wherein the vibration damping material layer(s) each has a thickness of about 0.013 to 0.13 mm.

12. The circuit article of claim 3 wherein the viscoelastic material is selected from the group consisting of thermoset polymers, thermoplastic polymers, and blends thereof.

13. The circuit article of claim 3 wherein the vibration damping material further comprises a fibrous material.

14. The circuit article of claim 3 wherein the vibration damping material includes an amount of fibrous material effective to improve vibrational damping of the circuit article by a factor of about 2.

15. The circuit article of claim 13 wherein the vibration damping material includes about 3 to about 60 weight percent fibrous material, based on the total weight of the vibration damping material.

16. The circuit article of claim 15 wherein the fibrous material is nonmetallic fibrous material.

17. The circuit article of claim 16 wherein the nonmetallic fibrous material is glass.

18. The circuit article of claim 3 wherein the vibration damping material further comprises a particulate material.

19. The circuit article of claim 3 wherein the vibration damping material includes an amount of particulate material effective to improve vibration damping of the circuit article by a factor of about 2.

20. The circuit article of claim 3 wherein the vibration damping material includes about 0.5 to about 70 weight percent of particulate material based on the total weight of the vibration damping material.

21. The circuit article of claim 18 wherein the particulate material is selected from the group consisting of glass bubbles, glass beads, ceramic bubbles, ceramic beads, thermally conductive bubbles, aluminum oxide powder, aluminum nitride powder, silica, and cured epoxy nodules.

22. The circuit article of claim 3 wherein the vibration damping material further comprises a fibrous material and a particulate material.

23. The circuit article of claim 22 wherein the vibration damping material includes about 0.5 to about 70 weight percent total of fibrous material plus particulate material based on the total weight of the vibration damping material.

24. The circuit article of claim 3 wherein the vibration damping is improved by at least about 10% in at least one vibrational mode.

25. The article of claim 3 which contains a single layer of vibration damping material wherein said layer is positioned within the article at a distance of at least about 5% of the thickness of the article from an upper and lower surface of the article.

26. The article of claim 3 which contains a single layer of vibration damping material wherein said layer is positioned within the article at a distance of at least about 30% of the thickness of the article from an upper and lower surface of the article.

27. The circuit article of claim 3 wherein the circuit article has one layer of damping material positioned equidistant from an upper surface of the article and a lower surface of the article.

28. The article of claim 3 which contains at least two layers of vibration damping material wherein each damping material layer is positioned within the article such that it is at least about 5% of the thickness of the article away from an upper and lower surface of the article and each vibration damping material layer is at least about 5% of the thickness of the article away from another vibration damping layer.

29. The article of claim 3 which contains at least two layers of vibration damping material wherein each damping material layer is positioned within the article such that it is at least about 5% of the thickness of the article away from an upper and lower surface of the article and each vibration damping material is at least about 20% of the article thickness away from another damping layer.

30. The article of claim 28 which contains at least two layers of vibration damping material wherein each damping material layer is positioned within the article such that it is at least about 5% of the thickness of the article away from an upper and lower surface of the article and each vibration damping material is at least about 30% of the article thickness away from another damping layer.

31. The circuit article of claim 3 wherein the vibration damping material further comprises an electrically conducting particle material that conducts in only one direction.

32. The circuit article of claim 3 wherein the vibration damping material further comprises an epoxy resin material, wherein said epoxy resin material may optionally have vibration damping properties.

33. The circuit article of claim 3 wherein the vibration damping layer is a continuous layer.

34. The circuit article of claim 3 wherein the vibration damping layer is a continuous layer made up of adjacent sections of different vibration damping materials having optimal damping properties over different temperature ranges.

35. The circuit article of claim 3 wherein the article contains at least two layers of vibration damping material, wherein at least two of the layers comprise different damping materials having optimal damping properties over different temperature ranges.

36. The circuit article of claim 3 wherein the vibration damping layer is a discontinuous layer.

37. The article of claim 36 wherein the discontinuous layer comprises sections of damping material separated by non-damping material or spaces.

* * * * *